United States Patent
Kato et al.

(10) Patent No.: US 10,734,221 B2
(45) Date of Patent: Aug. 4, 2020

(54) METHOD OF MANUFACTURING SEMICONDUCTOR DEVICE AND METHOD OF FORMING METAL OXIDE FILM

(71) Applicant: TOKYO ELECTRON LIMITED, Tokyo (JP)

(72) Inventors: Taiki Kato, Nirasaki (JP); Hisashi Higuchi, Nirasaki (JP); Kosuke Yamamoto, Nirasaki (JP); Ayuta Suzuki, Nirasaki (JP); Kazuyoshi Matsuzaki, Nirasaki (JP); Yuji Seshimo, Oshu (JP); Susumu Takada, Nirasaki (JP); Yoshihiro Takezawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 208 days.

(21) Appl. No.: 16/028,656

(22) Filed: Jul. 6, 2018

(65) Prior Publication Data

US 2019/0013195 A1   Jan. 10, 2019

(30) Foreign Application Priority Data

Jul. 7, 2017 (JP) .................................. 2017-133691
Apr. 24, 2018 (JP) .................................. 2018-083356

(51) Int. Cl.
*H01L 21/02* (2006.01)
*H01L 29/786* (2006.01)
(Continued)

(52) U.S. Cl.
CPC ........ *H01L 21/0228* (2013.01); *C23C 16/045* (2013.01); *C23C 16/405* (2013.01);
(Continued)

(58) Field of Classification Search
CPC ............... H01L 21/02; H01L 21/02008; H01L 21/0201; H01L 21/02104; H01L 21/02107;
(Continued)

(56) References Cited

U.S. PATENT DOCUMENTS 6,892,473 B1 * 5/2005 Chiang .................. B01D 53/28
                                                    34/332
7,250,374 B2 * 7/2007 Gale ................. H01L 21/31111
                                                    257/E21.251
(Continued)

FOREIGN PATENT DOCUMENTS

KR         10-0685748 B1    2/2007
KR       1020100087921 A    8/2010
(Continued)

OTHER PUBLICATIONS

Shirazi, Mandi, et al "Multiple Proton Diffusion and Film Densification in Atomic Layer Deposition Modeled by Density Functional Theory", ACS Publications, 25, pp. 878-889, 2013.

*Primary Examiner* — Maliheh Malek
(74) *Attorney, Agent, or Firm* — Nath, Goldberg & Meyer; Jerlad L. Meyer

(57) ABSTRACT

A method of manufacturing a semiconductor device having a metal oxide film with workpiece accommodated in a chamber, includes: supplying a precursor gas containing a metal complex into the chamber to form a precursor layer on the workpiece from the precursor gas; supplying an oxidizing gas into the chamber to oxidize the precursor layer so that a metal oxide layer is formed, the oxidizing gas being a gas containing $H_2O$ or a gas having a functional group containing hydrogen atoms in the metal complex and containing an oxidant to generate $H_2O$ by reaction with the functional group; supplying an $H_2O$ removal gas containing alcohols or amines into the chamber to remove $H_2O$
(Continued)

adsorbed onto the metal oxide layer; and executing a plurality of cycles each including the supplying a precursor gas and the supplying an oxidizing gas. At least some of the cycles includes the supplying an $H_2O$ removal gas.

15 Claims, 6 Drawing Sheets

(51) Int. Cl.
    *H01L 29/51*     (2006.01)
    *H01L 29/423*     (2006.01)
    *C23C 16/455*     (2006.01)
    *C23C 16/04*     (2006.01)
    *C23C 16/40*     (2006.01)
    *H01L 21/28*     (2006.01)
    *H01L 49/02*     (2006.01)
    *H01L 21/443*     (2006.01)

(52) U.S. Cl.
    CPC .. *C23C 16/45527* (2013.01); *C23C 16/45534* (2013.01); *H01L 21/02175* (2013.01); *H01L 21/02178* (2013.01); *H01L 21/02181* (2013.01); *H01L 21/02183* (2013.01); *H01L 21/02186* (2013.01); *H01L 21/02189* (2013.01); *H01L 21/02274* (2013.01); *H01L 21/28194* (2013.01); *H01L 21/443* (2013.01); *H01L 28/60* (2013.01); *H01L 29/4236* (2013.01); *H01L 29/517* (2013.01); *H01L 29/7869* (2013.01)

(58) Field of Classification Search
    CPC ........... H01L 21/02112; H01L 21/0234; H01L 21/02414; H01L 21/02565; H01L 21/02148–02159; H01L 21/02178–02192; H01L 21/022; H01L 21/0223; H01L 21/02233; H01L 21/02252; H01L 21/0228; H01L 21/02323; H01L 21/02337; H01L 29/4236; H01L 29/517; H01L 29/7869; C23C 16/045; C23C 16/405; C23C 16/455; C23C 16/45525; C23C 16/45527; C23C 16/45534
    See application file for complete search history.

(56) References Cited

U.S. PATENT DOCUMENTS

| | | | | |
|---|---|---|---|---|
| 9,234,275 B2* | 1/2016 | Takezawa | ............ | C23C 16/308 |
| 9,574,269 B2* | 2/2017 | Harada | ................... | C23C 16/18 |
| 10,037,884 B2* | 7/2018 | Ou | ........................ | H01L 21/32 |
| 2003/0185981 A1* | 10/2003 | Min | ....................... | C23C 16/40 |
| | | | | 427/255.28 |
| 2004/0005753 A1* | 1/2004 | Kostamo | ................ | C23C 16/40 |
| | | | | 438/222 |
| 2004/0203254 A1* | 10/2004 | Conley, Jr. | ........ | C23C 16/45527 |
| | | | | 438/778 |
| 2005/0120877 A1* | 6/2005 | Wu | ........................ | B01D 53/02 |
| | | | | 95/117 |
| 2007/0049053 A1* | 3/2007 | Mahajani | ............ | C23C 16/0218 |
| | | | | 438/785 |
| 2007/0148350 A1* | 6/2007 | Rahtu | ............... | H01L 21/32056 |
| | | | | 427/249.17 |
| 2012/0326143 A1* | 12/2012 | Tsurume | ............. | H01L 27/1225 |
| | | | | 257/43 |
| 2013/0036904 A1* | 2/2013 | Zheng | ...................... | B01J 20/06 |
| | | | | 95/26 |
| 2013/0048977 A1* | 2/2013 | Watanabe | ......... | H01L 29/78606 |
| | | | | 257/43 |
| 2013/0095394 A1* | 4/2013 | Tanaami | ............... | H01M 12/06 |
| | | | | 429/405 |
| 2014/0161706 A1* | 6/2014 | Takezawa | ............ | C23C 16/308 |
| | | | | 423/326 |
| 2014/0235067 A1* | 8/2014 | Shimamoto | ............ | C23C 16/36 |
| | | | | 438/763 |
| 2014/0287595 A1* | 9/2014 | Shimamoto | ....... | H01L 21/02126 |
| | | | | 438/774 |
| 2015/0087140 A1* | 3/2015 | Nozawa | ................ | C23C 16/511 |
| | | | | 438/508 |
| 2015/0087159 A1* | 3/2015 | Kuribayashi | ..... | H01J 37/32449 |
| | | | | 438/765 |
| 2015/0217532 A1* | 8/2015 | Kuraseko | ................ | B32B 27/00 |
| | | | | 156/230 |
| 2016/0111684 A1* | 4/2016 | Savas | ................... | H01L 51/5256 |
| | | | | 257/40 |
| 2016/0218219 A1* | 7/2016 | Asami | ................. | H01L 27/1225 |
| 2016/0264509 A1* | 9/2016 | Kaller | ...................... | C07C 67/08 |
| 2016/0281224 A1* | 9/2016 | Harada | .................. | C23C 16/455 |
| 2017/0146483 A1* | 5/2017 | Javey | ................. | G01N 27/4148 |
| 2017/0186778 A1* | 6/2017 | Miyake | ............... | H01L 27/1225 |
| 2017/0287696 A1* | 10/2017 | Noda | .................... | C23C 16/455 |
| 2018/0005814 A1* | 1/2018 | Kumar | ................ | H01L 21/0228 |
| 2018/0061628 A1* | 3/2018 | Ou | .................... | H01L 21/02266 |
| 2019/0143294 A1* | 5/2019 | Kiattikomol | ............. | B01J 20/24 |
| | | | | 502/401 |
| 2019/0172707 A1* | 6/2019 | Umehara | .......... | C23C 16/45544 |

FOREIGN PATENT DOCUMENTS

| | | |
|---|---|---|
| KR | 1020110007262 A | 1/2011 |
| KR | 1020110087334 A | 8/2011 |
| KR | 10-2011-0134376 A | 12/2011 |

\* cited by examiner

METHOD OF MANUFACTURING SEMICONDUCTOR DEVICE AND METHOD OF FORMING METAL OXIDE FILM

CROSS-REFERENCE TO RELATED APPLICATIONS

This application is based upon and claims the benefit of priority from Japanese Patent Application Nos. 2017-133691 and 2018-083356, filed on Jul. 7, 2017 and Apr. 24, 2018, respectively, the entire contents of which are incorporated herein by reference.

TECHNICAL FIELD

The present disclosure relates to a semiconductor device manufacturing method and a metal oxide film forming method.

BACKGROUND

In recent years, a high dielectric constant insulating film (high-K insulating film) has been used as a gate insulating film and a capacitor insulating film in a semiconductor device. As such a high dielectric constant insulating film, for example, an insulating film made of metal oxide having a high dielectric constant, such as $HfO_2$, is known.

In a semiconductor device, in order to secure a channel length in a transistor, increase the capacitance of a capacitor or the like, a trench is formed in a surface of a semiconductor substrate and metal oxide films (a gate insulating film and a capacitor insulating film) are formed on the surface in which the trench is formed. To this end, it becomes important to form a conformal metal oxide film with good step coverage.

In this connection, as a method of forming a metal oxide film, a chemical vapor deposition (CVD) method, an atomic layer deposition (ALD) method and the like are known. Among these, the ALD method has attracted attention since it can obtain a conformal metal oxide film. The term "conformal" used herein means that followability to the shape of a surface to be processed (surface on which a metal oxide film is formed) of a workpiece to be processed by the ALD method is excellent and the metal oxide film has an even thickness distribution.

As one example of a method of forming a metal oxide film using the ALD method, there has been used a method of forming a film made of $HfO_2$ by forming a precursor layer on a substrate using tetrakis(dimethylamino)hafnium (TDMAH) as a precursor, followed by oxidizing the precursor layer with $H_2O$.

However, the conventional method fails to obtain a conformal metal oxide film when a process (ALD process) of forming a metal oxide film is performed under low temperature conditions.

SUMMARY

Some embodiments of the present disclosure provide a metal oxide film forming method, which is capable of forming a conformal metal oxide film even under low temperature conditions, and a semiconductor device manufacturing method using the metal oxide film forming method.

According to one embodiment of the present disclosure, there is provided a method of manufacturing a semiconductor device having a metal oxide film in a state in which a workpiece is accommodated in a chamber, the method including: supplying a precursor gas containing a metal complex into the chamber to form a precursor layer on the workpiece from the precursor gas; supplying an oxidizing gas into the chamber to oxidize the precursor layer so that a metal oxide layer is formed, the oxidizing gas being a gas containing $H_2O$ or a gas having a functional group containing hydrogen atoms in the metal complex and containing an oxidant to generate the $H_2O$ by reaction with the functional group; supplying an $H_2O$ removal gas containing alcohols or amines into the chamber to remove the $H_2O$ adsorbed onto the metal oxide layer; and executing a plurality of cycles each including the supplying a precursor gas and the supplying an oxidizing gas, wherein at least some of the plurality of cycles includes the supplying an $H_2O$ removal gas.

According to another embodiment of the present disclosure, there is provided a method of forming a metal oxide film on a workpiece by an atomic layer deposition technique in a state in which the workpiece is accommodated in a chamber, the method including: supplying a precursor gas containing a metal complex into the chamber to form a precursor layer on the workpiece from the precursor gas; supplying an oxidizing gas into the chamber to oxidize the precursor layer so that a metal oxide layer is formed, the oxidizing gas being a gas containing $H_2O$ or a gas having a functional group containing hydrogen atoms in the metal complex and containing an oxidant to generate the $H_2O$ by reaction with the functional group; supplying an $H_2O$ removal gas containing alcohols or amines into the chamber to remove the $H_2O$ adsorbed onto the metal oxide layer; and executing a plurality of cycles each including the supplying a precursor gas and the supplying an oxidizing gas, wherein at least some of the plurality of cycles includes the supplying an $H_2O$ removal gas.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

The present inventors have found that some of $H_2O$ used as an oxidant in an ALD method may be adsorbed onto a metal oxide layer by hydrogen bonding and that $H_2O$ adsorbed onto the metal oxide layer may stay on the metal oxide layer without being removed at a low process temperature. The present inventors have presumed that the self-limiting property peculiar to the ALD method deteriorates due to such $H_2O$, which may make it impossible to achieve a conformal metal oxide film. That is to say, when a precursor layer is formed on the metal oxide layer, the $H_2O$ reacts (hydrolysis reaction) with a metal complex as a precursor, thereby causing an exchange between ligands of the metal complex to generate a precursor having a hydroxyl group (OH group). Since an OH group in this precursor has the same reactivity as an OH group formed on the surface of a workpiece to be processed, the precursor after the ligand exchange reacts with the precursor constituting the precursor layer. In this way, the present inventors have presumed that the self-limiting property deteriorates due to further precursor deposition occurring on the precursor layer, which may make it impossible to achieve a conformal metal oxide film.

Therefore, the present inventors have examined oxidation of the precursor layer using an oxidant such as $O_3$ instead of $H_2O$. However, even with this method, it has been found that a conformal metal oxide film cannot be achieved when the metal complex has a functional group containing hydrogen atoms. It is presumed that this is because $H_2O$ is by-produced due to extraction of hydrogen atoms in the functional group of the metal complex by the oxidant and the self-limiting property deteriorates due to the by-produced $H_2O$.

As a result of further examination based on the above findings, the present inventors have found that the $H_2O$ adsorbed onto the metal oxide layer can be removed by introducing a specific gas into a chamber before a precursor gas is supplied after the metal oxide layer is formed and that further deposition of the precursor on the precursor layer is suppressed in a subsequent step of supplying the precursor gas, thus completing the present disclosure.

Figure 1:
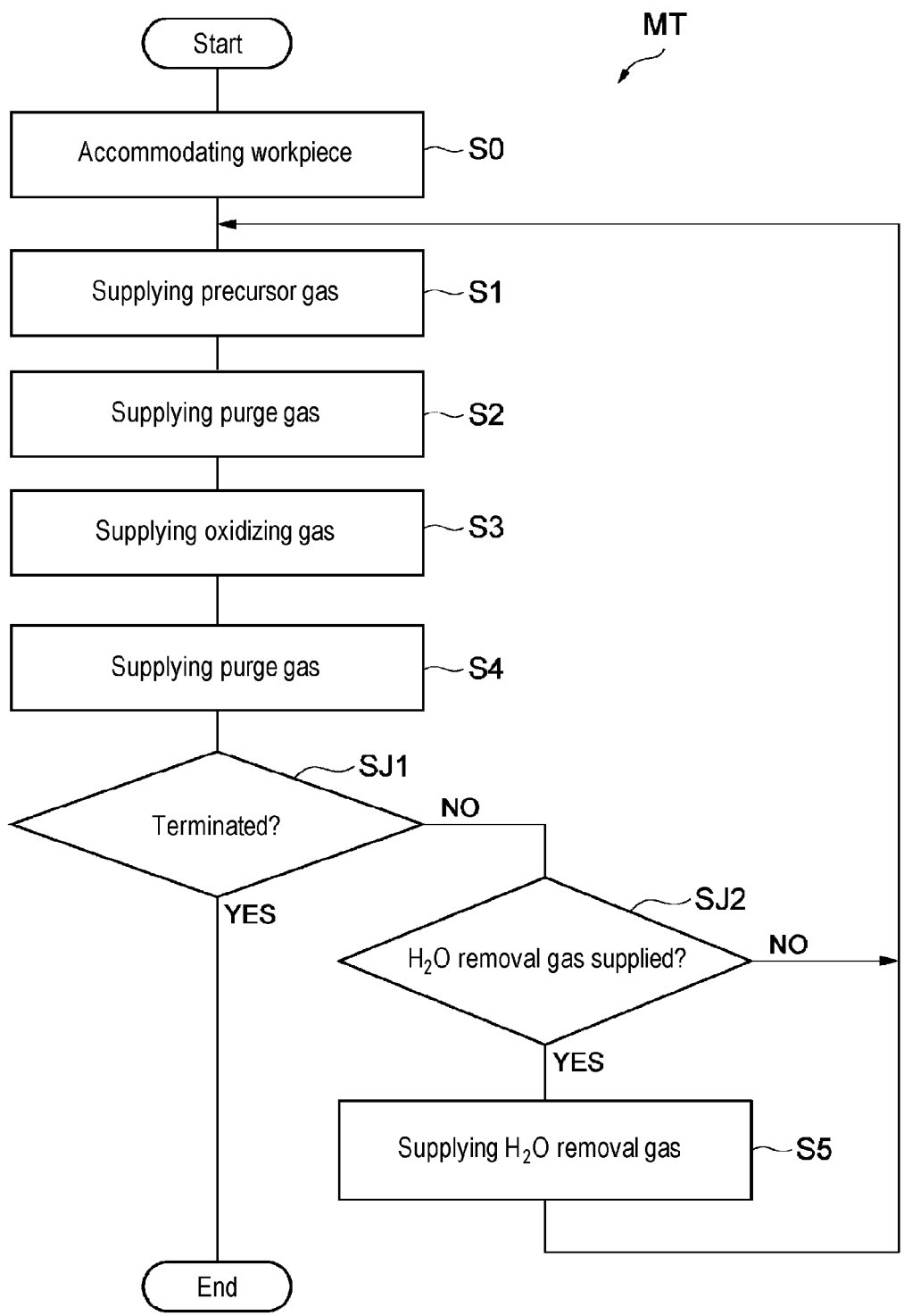
FIG. 1 is a flowchart showing a metal oxide film forming method according to one embodiment.

FIG. 1 is a flowchart showing a metal oxide film forming method according to one embodiment. A method MT shown in FIG. 1 is a method of forming a metal oxide film on a workpiece using an atomic layer deposition method. The method MT is executed in a state where the workpiece is accommodated in a chamber. The method MT includes a step S0 of accommodating the workpiece in a chamber, a step S1 of supplying a precursor gas containing a metal complex into the chamber, a step S2 of supplying a purge gas into the chamber, a step S3 of supplying an oxidizing gas into the chamber, a step S4 of supplying a purge gas into the chamber, a step S5 of supplying an $H_2O$ removal gas containing alcohols or amines into the chamber, a step SJ1 of determining whether to terminate the method MT, and a step SJ2 of determining whether to execute step S5.

In the method MT, a plurality of cycles each including step S1, step S2, step S3 and step S4 is executed. Specifically, a sequence of steps S1 to S4 is first executed in this order, and step SJ1 is then executed. In step SJ1, it is determined whether to terminate the execution of the plurality of cycles. That is to say, if the cycles have not been executed plural times or a predetermined number of times, the result of the determination in step SJ1 is NO. When the result of the determination in step SJ1 is NO, step SJ2 is executed. In step SJ2, it is determined whether to execute step S5. At least some of the plurality of cycles includes step S5. If the result of the determination in step SJ2 is YES, step S5 is executed and then the cycle is repeated again. If the result of the determination in step SJ2 is NO, the cycle is repeated again without executing step S5.

In the method MT, from the viewpoint of improving throughput, the purge gas may not be supplied into the chamber before step S1 is executed again after step S5 is executed.

Step S5 is an arbitrary step in each cycle. However, step S5 may be executed in order to obtain a more conformal metal oxide film. However, from the viewpoint of improving throughput, the final cycle of the plurality of cycles in the method MT may not include step S5. If the final cycle does not include step S5, step S4 is executed between step S3 and step S1 in a subsequent cycle. In a case of terminating the method MT after step S3, step S4 is executed between step S3 and the termination of the method MT.

In the method MT described above, after a first metal oxide layer is formed in a first cycle, a second metal oxide layer is formed on the first metal oxide layer in a subsequent cycle. In this manner, by repeatedly executing a plurality of cycles, a metal oxide film composed of a plurality of metal oxide layers is obtained. The number of repetitions of cycle in the method MT may be appropriately set so as to obtain the oxide film having an intended thickness.

Hereinafter, the details of steps S0 to S5 in the method MT will be described with reference to FIG. 2. The contents of steps S1 to S5 in one cycle may be the same as or different from the contents of steps S1 to S5 in other cycles.

Figure 2:
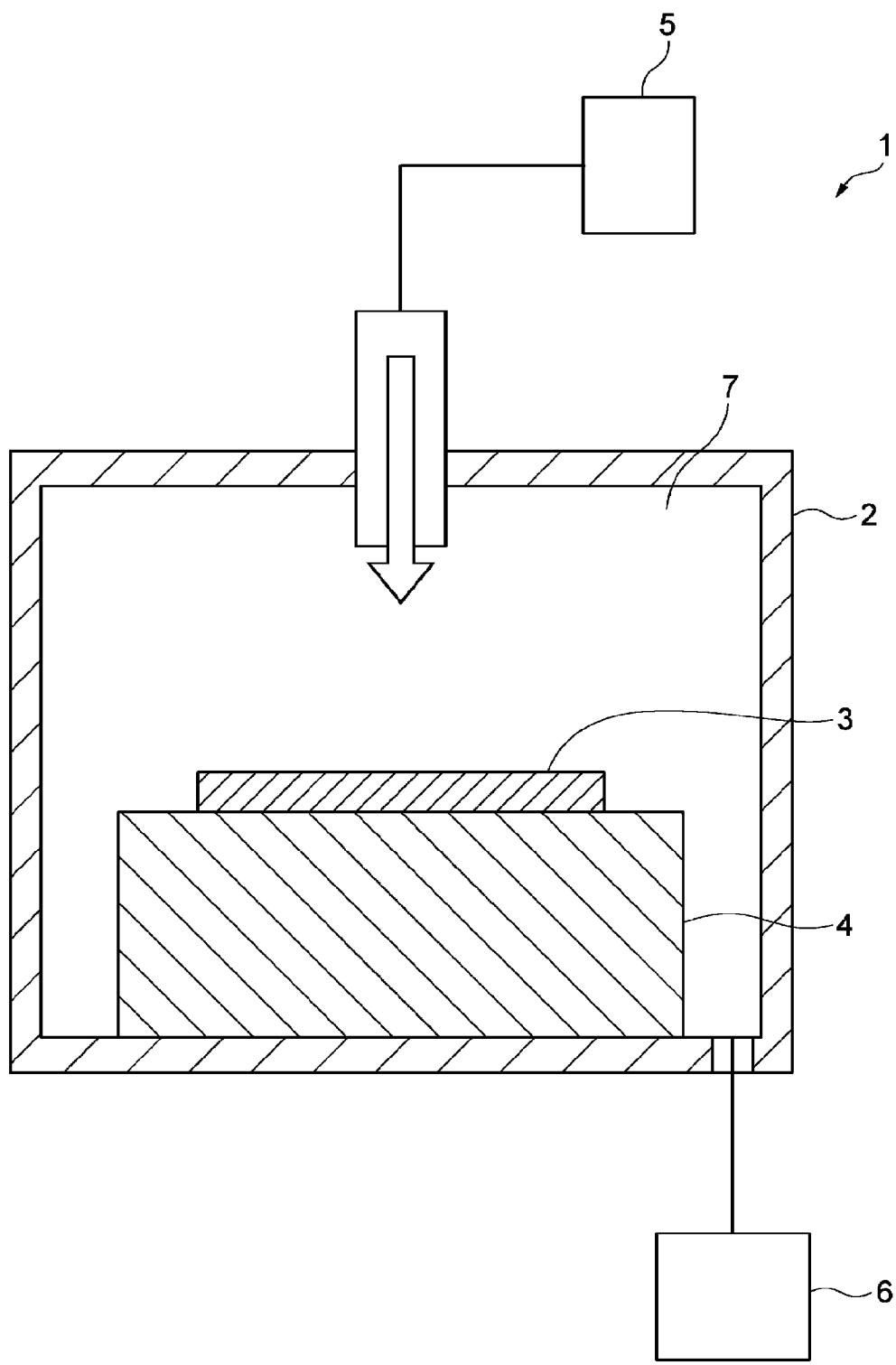
FIG. 2 is a schematic cross-sectional view illustrating a film forming apparatus used for the metal oxide film forming method according to one embodiment.

FIG. 2 is a schematic cross-sectional view illustrating a film forming apparatus used in the metal oxide film forming method according to one embodiment. In FIG. 2, an arrow indicates a direction of supply of a gas (a precursor gas, an oxidizing gas, an $H_2O$ removal gas, a purge gas or the like). The film forming apparatus (ALD film forming apparatus) 1 includes a chamber body 2, a stage 4, a gas supply part 5 and an exhaust device 6. An internal space of the chamber body 2 is defined as a chamber 7. The stage 4 is installed inside the chamber 7. The stage 4 is configured to support a workpiece 3 disposed thereon. The gas supply part 5 and the exhaust device 6 are installed outside the chamber body 2 and are connected to the chamber body 2. The gas supply part 5 is configured to supply the plural kinds of gases to be used in the method MT into the chamber 7. The exhaust device 6 includes one or more pumps such as a turbo molecular pump and a dry pump, and a pressure control valve, and is configured to exhaust an interior of the chamber 7. Although a single supply part 5 and a single exhaust device 6 are illustrated in FIG. 2, a plurality of gas supply parts and a plurality of exhaust devices may be used.

In step S0, the workpiece 3 is disposed on the stage 4. A base material (e.g., a substrate) to which the ALD method can be applied can be widely used as the workpiece 3. The base material to which the ALD method can be applied is, for example, a semiconductor substrate made of silicon or the like. Examples of such a workpiece may include a semiconductor substrate used to manufacture a semiconductor device having a capacitor insulating film, a semiconductor substrate used to manufacture a semiconductor device having a gate insulating film, and the like.

In step S1, a metal complex in a precursor gas is chemically adsorbed onto the workpiece 3 to form a precursor layer from the precursor gas. Specifically, when the precursor gas is supplied from the gas supply part 5 into the chamber 7, the precursor gas comes into contact with a surface (surface to be processed) of the workpiece 3, so that the metal complex is chemically adsorbed onto the surface of the workpiece 3. That is to say, metal atoms in the metal complex react with a functional group such as a hydroxyl group formed on the surface of the workpiece 3 so that the metal complex (precursor) is chemically adsorbed onto the surface of the workpiece 3. This results in formation of a precursor layer composed of a plurality of precursors that is bonded to the surface of the workpiece 3. Typically, since ligands are not exchanged between metal complexes, only one molecule of the metal complex is chemically adsorbed but metal atoms are not further deposited in a direction perpendicular to the surface of the workpiece 3. Therefore, in step S1, a precursor layer having a uniform thickness is obtained. The term "precursor gas" used herein means a gas composed of a precursor containing a metal complex. Although a precursor before being chemisorbed onto the workpiece is different in terms of structure from a precursor after being chemisorbed onto the workpiece, these precursors will be hereinafter collectively referred to as a precursor for the sake of convenience in description.

In step S1, various metal complexes may be used depending on the type of metal constituting a target metal oxide film. Any metal complex may be used as long as it can be chemically adsorbed onto the surface of the workpiece 3. The metal complex is represented, for example, by the following chemical formula (1).

[Chemical Formula 1]

(1)

In the chemical formula 1, M represents a central metal, and $L^1$ to $L^4$ represent ligands independently. $L^1$ to $L^4$ may be the same as or different from each other.

The central metal may be hafnium, zirconium, aluminum, tantalum, tungsten, titanium, niobium, molybdenum, cobalt, nickel or the like. That is to say, the metal complex may be a hafnium complex, a zirconium complex, an aluminum complex, a tantalum complex, a tungsten complex, a titanium complex, a niobium complex, a molybdenum complex, a cobalt complex, a nickel complex or the like. From the viewpoint of obtaining a metal oxide film having a high dielectric constant, the metal complex may be a hafnium complex, a zirconium complex, an aluminum complex, a tantalum complex or a tungsten complex.

Examples of the ligands may include alcohols such as t-butylalcohol, isopropylalcohol, isobutylalcohol and the like, amines such as dimethylamine, ethylmethylamine, diethylamine, t-butylamine and the like, cyclopentadiene, butadiene, benzene, and the like.

The ligands may have a functional group containing hydrogen atoms. When the ligands have a functional group containing hydrogen atoms, an oxidant in an oxidizing gas supplied in step S3 to be described later may react with the functional group to produce $H_2O$. Therefore, when the ligands have a functional group containing hydrogen atoms and the oxidizing gas is a gas containing an oxidant which reacts with the functional group to produce $H_2O$, the effects of the present disclosure are remarkably exhibited. An example of the functional group containing hydrogen atoms may include a hydrocarbon group.

Examples of the metal complex may include $Hf[N(CH_3)_2]_4$, $Hf[N(CH_2CH_3)(CH_3)]_4$, $Hf[N(CH_3)_2]_3[C_5H_5]$, $Hf[N(CH_2CH_3)_3]_4$ and $Hf[OC(CH_3)_3]_4$. Among these, at least one selected from a group consisting of $Hf[N(CH_3)_2]_4$, $Hf[N(CH_2CH_3)(CH_3)]_4$ and $Hf[N(CH_3)_2]_3[C_5H_5]$ may be used to ensure a vapor pressure.

The conditions for supplying the precursor gas in step S1 are not particularly limited but may be conventionally known conditions for forming a precursor layer using the ALD method. However, when an internal temperature of the chamber 7 is high, decomposition of the precursor (for example, cleavage of the bond between the workpiece and the precursor, desorption of the ligands, etc.) occurs, which may make it difficult to obtain a conformal metal oxide film. Further, with the refinement of a semiconductor substrate or the like serving as a workpiece, a low temperature process is required. Therefore, the internal temperature of the chamber 7 when the precursor gas is supplied into the chamber 7 may be 700 degrees C. or lower. The internal temperature of the chamber 7 when the precursor gas is supplied into the chamber 7 may be, for example, 100 degrees C. or higher. The internal pressure of the chamber 7 when the precursor gas is supplied into the chamber 7 may be, for example, 10 Pa or more and may be 50,000 Pa or less. The supply amount (supply time and flow rate) of the precursor gas may be adjusted according to the size or the like of the workpiece. The supply amount of the precursor gas may be, for example, 0.1 sccm or more and may be 1,000 sccm or less. In step S1, the precursor gas may be continuously supplied in the form of a pulse so that all OH groups on the surface of the workpiece 3 react with the metal complex.

The supply of the precursor gas may be performed under a dilution gas (first dilution gas) environment. For example, the precursor gas may be supplied after replacing the interior of the chamber 7 with the first dilution gas. In addition, the first dilution gas may be supplied into the chamber 7, for example together with the precursor gas. In this case, the precursor gas may be supplied while supplying the first dilution gas into the chamber 7. Alternatively, the precursor gas and the first dilution gas may be mixed and the precursor gas (mixed gas) diluted with the first dilution gas may be supplied into the chamber 7. Examples of the first dilution gas may include a nitrogen ($N_2$) gas, an inert gas such as a noble gas, a carbon dioxide ($CO_2$) gas and a carbon monoxide (CO) gas. The first dilution gas may include at least one selected from a group consisting of a helium (He) gas, a neon (Ne) gas, an argon (Ar) gas, a krypton (Kr) gas, a xenon (Xe) gas, an $N_2$ gas, a $CO_2$ gas and a CO gas.

In step S2, the precursor gas is removed from the chamber 7 by the purge gas. Specifically, when the purge gas is supplied from the gas supply part 5 into the chamber 7, the precursor gas in the chamber 7 is removed, together with the purge gas, from the chamber 7 by the exhaust device 6. Examples of the purge gas may include an inert gas such as a nitrogen gas, a noble gas (for example, an argon gas, etc.) or the like, a carbon dioxide gas and a carbon monoxide gas. Gases corresponding to the precursor gas, the oxidizing gas and the $H_2O$ removal gas are not included in the purge gas. The conditions for supplying the purge gas in step S2 are not particularly limited but may be 700 degrees or lower from the viewpoint of suppressing the decomposition of the precursor and reducing a thermal damage to the workpiece. The internal temperature of the chamber 7 when the purge gas is supplied into the chamber 7 may be, for example, 100 degrees C. or higher. An internal pressure of the chamber 7 when the purge gas is supplied into the chamber 7 may be, for example, 10 Pa or more and may be 50,000 Pa or less.

The supply amount (supply time and flow rate) of the purge gas may be appropriately set so that the precursor gas is completely removed. The supply amount of the purge gas may be, for example, 0.1 sccm or more and may be 1,000 sccm or less.

In step S3, the precursor layer is oxidized by the oxidizing gas to form a metal oxide layer. Specifically, when the oxidizing gas is supplied from the gas supply part 5 into the chamber 7, the oxidant in the oxidizing gas comes into contact with the precursor layer and the precursor constituting the precursor layer reacts with the oxidant. As a result, the precursor is oxidized to form a metal oxide layer composed of metal oxide. At this time, the ligands are desorbed from the precursor.

The oxidizing gas is a gas containing $H_2O$ (for example, an $H_2O$ gas), or a gas containing an oxidant that reacts with a functional group containing hydrogen atoms of the metal complex to generate $H_2O$ (for example, a gas of an oxidant that reacts with a functional group containing hydrogen atoms of the metal complex to generate $H_2O$). A gas corresponding to the $H_2O$ removal gas is not included in the oxidizing gas. Examples of the oxidant that reacts with a functional group containing hydrogen atoms of the metal complex to form $H_2O$ may include $O_3$, $H_2/O_2$ mixture, $O_2$ plasma, $O_2$, $H_2O_2$ and the like. When a gas containing $H_2O$ is used as the oxidizing gas, $H_2O$ derived from the oxidizing gas is adsorbed onto the metal oxide film by hydrogen bonding. When a gas containing an oxidant such as $O_3$, $H_2/O_2$ mixture, $O_2$ plasma, $O_2$, $H_2O_2$ and the like is used as the oxidizing gas, $H_2O$ derived from the reaction between the oxidant and the functional group containing hydrogen atoms of the metal complex is adsorbed onto the oxide film by hydrogen bonding. From the viewpoint of forming a metal oxide layer under the low temperature conditions, the oxidizing gas may be a gas containing at least one selected from a group consisting of $O_3$, $H_2/O_2$ mixture, $O_2$ plasma, $O_2$ and $H_2O_2$, specifically a gas containing at least one selected from a group consisting of $O_3$, $H_2/O_2$ mixture and $O_2$ plasma.

The conditions for supplying the oxidizing gas in step S3 are not particularly limited but the internal temperature of the chamber 7 when the oxidizing gas is supplied into the chamber 7 may be 700 degrees or lower from the viewpoint of maintaining the bonding between the metal in the precursor layer and the metal oxide layer and the surface to be processed and from the viewpoint of reducing a thermal damage to the workpiece 3. The internal temperature of the chamber 7 when the oxidizing gas is supplied into the chamber 7 may be, for example, 100 degrees C. or higher. The internal pressure of the chamber 7 when the oxidizing gas is supplied into the chamber 7 may be, for example, 10 Pa or more and may be 50,000 Pa or less. The supply amount (supply time and flow rate) of the oxidizing gas may be appropriately set so that the precursor constituting the precursor layer is completely oxidized. The supply amount of the oxidizing gas may be, for example, 0.1 sccm or more and may be 1,000 sccm or less.

The supply of the oxidizing gas may be performed under a dilution gas (second dilution gas) environment. For example, the oxidizing gas may be supplied after replacing the interior of the chamber 7 with the second dilution gas. In addition, the second dilution gas may be supplied into the chamber 7, for example together with the oxidizing gas. In this case, the oxidizing gas may be supplied while supplying the second dilution gas into the chamber 7. Alternatively, the oxidizing gas and the second dilution gas may be mixed and the oxidizing gas (mixed gas) diluted with the second dilution gas may be supplied into the chamber 7. The details of the second dilution gas are the same as those of the above-described first dilution gas.

In step S4, when the purge gas is supplied from the gas supply part 5 into the chamber 7, the oxidizing gas and the ligands derived from the precursor are removed from the chamber 7 by the exhaust device 6. The details of the purge gas and the conditions for supplying the purge gas in step S4 may be the same as those in the above-described step S2.

In step S5, $H_2O$ adsorbed onto the metal oxide layer is removed by the $H_2O$ removal gas. Specifically, when the $H_2O$ removal gas is supplied from the gas supply part 5 into the chamber 7, the $H_2O$ removal gas comes into contact with the metal oxide layer, so that $H_2O$ adsorbed onto the metal oxide layer is substituted with alcohols or amines in the $H_2O$ removal gas. As a result, $H_2O$ is desorbed from the surface of the metal oxide layer. The desorbed $H_2O$ is removed from the chamber 7 by continuously supplying the $H_2O$ removal gas.

The likelihood of substitution of $H_2O$ in step S5 can be predicted, for example, by evaluating the energy of adsorption of a substituted compound (e.g., alcohols and amines) onto the surface (surface site) of the metal oxide layer. That is to say, when the energy of adsorption of the substituted compound onto the surface (surface site) of the metal oxide layer is larger than the energy of adsorption of $H_2O$ onto the surface (surface site) of the metal oxide layer, it is predicted that $H_2O$ is easily substituted with the substituted compound. Alcohols and amines have high polarity and exhibit the energy of adsorption higher than $H_2O$ on the surface site of the metal oxide layer. Therefore, in the present embodiment, the alcohols or amines and the $H_2O$ adsorbed onto the metal oxide layer interfere with each other on the surface site. As a result, it is inferred that $H_2O$ is substituted with alcohols or amines with a certain probability and is desorbed from the surface of the metal oxide layer. The adsorption energy can be obtained, for example, by a density functional formalism (PBE/DN) using a $DMol^3$ module of Software Materials Studio.

Alcohols or amines adsorbed onto the metal oxide layer can react with the metal complex which is a precursor, when step S1 is performed again, like $H_2O$, but do not react with other precursors due to steric hindrance. Therefore, in the present embodiment, deposition of two or more precursors, which is a concern in the conventional ALD method, hardly occurs. That is to say, in the present embodiment, by executing step S5, it is possible to maintain the self-limiting property peculiar to ALD to obtain a conformal metal oxide film.

The $H_2O$ removal gas contains at least one of the alcohols and the amines and may contain both the alcohols and the amines.

The alcohols is an alcohol compound represented by the formula $R^1OH$ (where, $R^1$ represents a monovalent hydrocarbon group) and the amines is an amine compound represented by the formula $R^2R^3R^4$—N(where, $R^2$, $R^3$ and $R^4$ represent a hydrogen atom or a monovalent hydrocarbon group and at least one of $R^2$, $R^3$ and $R^4$ represents a monovalent hydrocarbon group. $R^2$, $R^3$ and $R^4$ may be the same as or different from each other.). The number of carbons in $R^1$, $R^2$, $R^3$ and $R^4$ may be, for example, 1 to 8. The hydrocarbon groups of $R^1$, $R^2$, $R^3$ and $R^4$ may be either linear, branched or cyclic and may be either saturated or unsaturated. $R^1$, $R^2$, $R^3$ and $R^4$ may have a substituent group as long as it does not inhibit the effects of the present disclosure. Specific examples of $R^1$, $R^2$, $R^3$ and $R^4$ may include an alkyl group such as a methyl group, an ethyl group, a propyl group, an isopropyl group, a t-butyl group and an isobutyl group, an allyl group, a phenyl group and the like.

Specific examples of the alcohols may include alkyl alcohols such as methyl alcohol (methanol), ethyl alcohol (ethanol), n-propyl alcohol (1-propanol), isopropyl alcohol (2-propanol), t-butyl alcohol (2-methyl-2-propanol), isobutyl alcohol (2-methyl-1-propanol) and the like, allyl alcohols, phenol and the like. Among these, at least one selected from a group consisting of methyl alcohol, ethyl alcohol, n-propyl alcohol, isopropyl alcohol and t-butyl alcohol may be used from the viewpoint of easy removal of $H_2O$ adsorbed onto the metal oxide.

Specific examples of the amines may include diethylamine, methylamine, ethylamine, isopropylamine, aniline and the like. Among these, at least one selected from a group consisting of diethylamine, ethylamine and methylamine may be used from the viewpoint of easy removal of $H_2O$ adsorbed onto the metal oxide.

The conditions for supplying the $H_2O$ removal gas in step S5 are not particularly limited but the internal temperature of the chamber 7 when the $H_2O$ removal gas is supplied into the chamber 7 may be 700 degrees or lower from the viewpoint of maintaining the bonding between the metal in the metal oxide layer and the surface to be processed and from the viewpoint of reducing a thermal damage to the workpiece. The internal temperature of the chamber 7 when the $H_2O$ removal gas is supplied into the chamber 7 may be, for example, 100 degrees C. or higher. The internal pressure of the chamber 7 when the $H_2O$ removal gas is supplied into the chamber 7 may be, for example, 10 Pa or more and may be 50,000 Pa or less. The supply amount (supply time and flow rate) of the $H_2O$ removal gas may be appropriately set so that all $H_2O$ adsorbed onto the metal oxide layer by hydrogen bonding is completely removed. The supply amount of the $H_2O$ removal gas may be, for example, 0.1 sccm or more and may be 1,000 sccm or less.

The supply of the $H_2O$ removal gas may be performed under a dilution gas (third dilution gas) environment. For example, the $H_2O$ removal gas may be supplied after replacing the interior of the chamber 7 with the third dilution gas. In addition, the third dilution gas may be supplied into the chamber 7, for example together with the $H_2O$ removal gas. In this case, the $H_2O$ removal gas may be supplied while supplying the third dilution gas into the chamber 7. Alternatively, the $H_2O$ removal gas and the third dilution gas may be mixed and the $H_2O$ removal gas (mixed gas) diluted with the third dilution gas may be supplied into the chamber 7. The details of the third dilution gas are the same as those of the above-described first dilution gas.

The above-described method MT can be suitably used to form a gate insulating film and a capacitor insulating film, for example. Particularly, in a semiconductor device having a memory cell such as 3DNAND, DRAM or the like, a step coverage of an insulating film becomes an important issue with the complication of a trench structure and an increase in aspect ratio of the trench, and the like. Thus, it is possible to form an ideal conformal film with high step coverage and low loading effects according to the above-described method MT.

Since the method MT can be carried out under the low temperature conditions, according to the method MT, it is possible to form a conformal metal oxide film even under the low temperature conditions. Further, by applying the method MT to a semiconductor device manufacturing method, it is possible to form a conformal insulating film (a capacitor insulating film, a gate insulating film and the like) while reducing a thermal damage to a semiconductor substrate in a process of forming the metal oxide film such as the capacitor insulating film, the gate insulating film and the like. That is to say, according to the method MT, it is possible to achieve a semiconductor device having a conformal insulating film (a capacitor insulating film, a gate insulating film and the like).

Next, the semiconductor device manufacturing method using the above-described method MT will be described with reference to FIGS. 3A to 3C and FIGS. 4A to 4C.

Figure 3A:
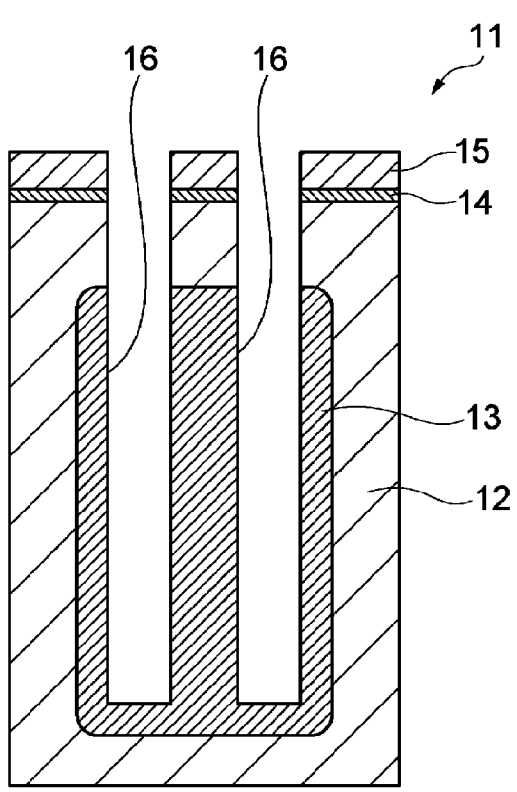
FIGS. 3A to 3C are schematic cross-sectional views showing a semiconductor device manufacturing method according to one embodiment.
Figure 3B:
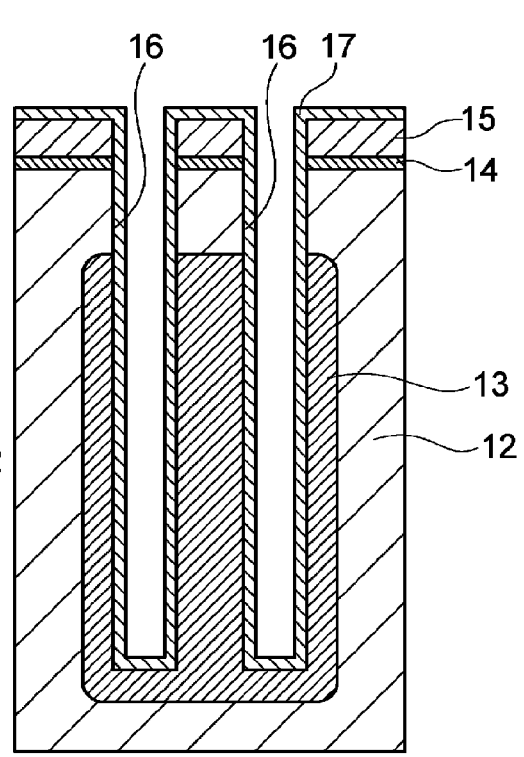
Figure 3C:
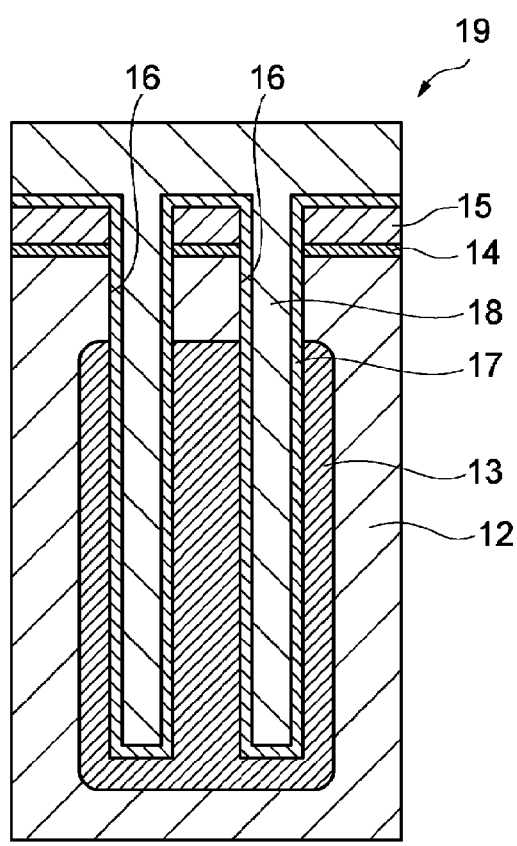

FIGS. 3A to 3C are schematic cross-sectional views showing the semiconductor device manufacturing method according to one embodiment. The manufacturing method of the present embodiment involves manufacturing a semiconductor device having a capacitor insulating film. In the manufacturing method of the present embodiment, first, as shown in FIG. 3A, a semiconductor substrate 11 is prepared as a workpiece. The semiconductor substrate 11 includes a substrate 12, a first electrode (plate electrode) 13, an oxide film 14 and a nitride film 15. The substrate 12 is made of a material containing silicon (Si), such as silicon nitride. The oxide film 14 is formed on the substrate 12 and the nitride film 15 is formed on the oxide film 14. Some trenches 16 are formed in a laminate including the substrate 12, the oxide film 14 and the nitride film 15. A partial region of the substrate 12 extending along the trenches 16 constitutes the first electrode 13. The first electrode 13 contains a dopant such as arsenic (As), phosphorus (P) or the like.

In the present embodiment, the surface of the semiconductor substrate 11 is a surface (surface to be processed) on which a metal oxide film is formed. The semiconductor substrate 11 is obtained by the following method, for example. First, the oxide film 14 and the nitride film 15 are sequentially formed on the substrate 12. Subsequently, the trenches 16 are formed in the laminate including the substrate 12, the oxide film 14 and the nitride film 15 by etching or the like. Thereafter, a dopant is implanted into the partial region of the substrate 12 along the trenches 16 by a method such as gas phase diffusion to form the first electrode 13. Through the above process, the semiconductor substrate 11 is obtained. Subsequently, as shown in FIG. 3B, by applying the metal oxide film forming method of this embodiment to the surface to be processed of the semiconductor substrate 11, a capacitor insulating film 17 formed of a metal oxide film is formed on the semiconductor substrate 11. Subsequently, as shown in FIG. 3C, a second electrode (node electrode) 18 is formed on the capacitor insulating film 17. The second electrode 18 is made of, for example, amorphous silicon, polysilicon or the like containing impurities of a predetermined conductivity type. Through the above process, it is possible to achieve a semiconductor device 19 having a conformal capacitor insulating film 17 with excellent step coverage.

A shape and size (width, depth, etc.) of the trenches 16 in the semiconductor substrate 11 are not particularly limited. The depth of the trenches 16 may be, for example, 0.1 to 10 μm. The width of the trenches 16 may be 5 to 500 nm. The aspect ratio (trench depth/trench width) of the trenches 16 may be, for example, 0.2 to 80. According to the method of the present embodiment, even when the aspect ratio of the trenches 16 is large (for example, 80 or more), it is possible to achieve excellent step coverage.

A thickness of the capacitor insulating film 17 may be, for example, 1 Å or more and may be 10,000 Å or less.

Figure 4A:
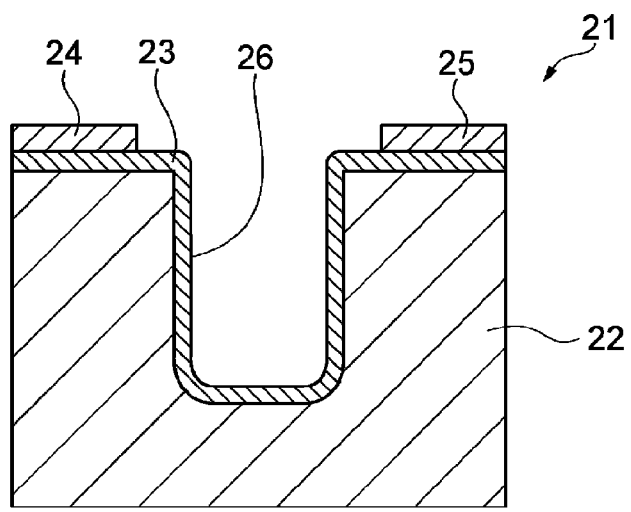
FIGS. 4A to 4C are schematic cross-sectional views showing a semiconductor device manufacturing method according to one embodiment.
Figure 4B:
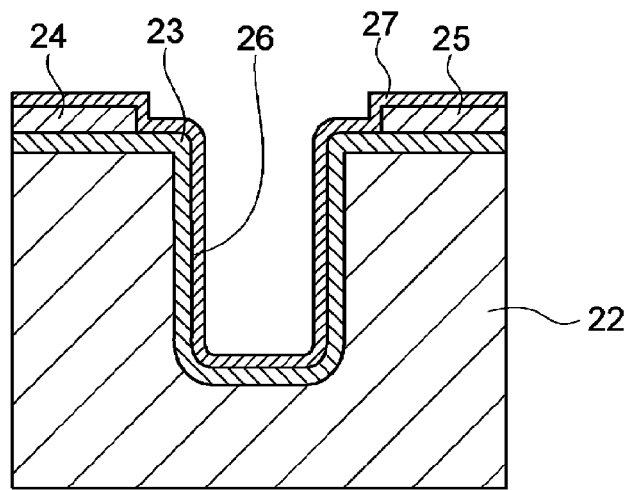
Figure 4C:
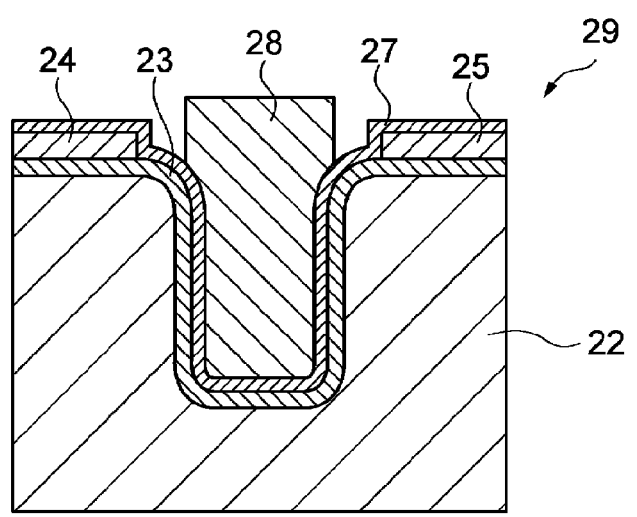

FIGS. 4A to 4C are schematic cross-sectional views showing a semiconductor device manufacturing method according to another embodiment. The manufacturing method of this embodiment involves manufacturing a semiconductor device having a gate insulating film. In the manufacturing method of this embodiment, first, as shown in FIG. 4A, a semiconductor substrate 21 is prepared as a workpiece. The semiconductor substrate 21 includes an oxide insulating film 22, an oxide semiconductor film 23, a first electrode (source electrode) 24 and a second electrode (drain electrode) 25. The oxide insulating film 22 is formed on a substrate made of silicon or the like (for example, a semiconductor substrate, not shown). The oxide semiconductor film 23 is formed on the oxide insulating film 22. A laminate including the oxide insulating film 22 and the oxide semiconductor film 23 provides a trench 26. Specifically, the trench 26 is defined by a surface of the oxide semiconductor film 23. The first electrode 24 and the second electrode 25 are formed on the oxide semiconductor film 23. The first electrode 24 and the second electrode 25 are located at both sides of the trench 26, respectively.

In this embodiment, the surface defining the trench 26 of the semiconductor substrate 21 is a surface (surface to be processed) on which a metal oxide film is formed. The semiconductor substrate 21 is obtained by the following method, for example. First, the oxide insulating film 22 made of silicon or the like is formed on the substrate by a sputtering method or the like. Subsequently, the surface of the oxide insulating film 22 is etched to form the trench 26 and then the oxide semiconductor film 23 is formed on the surface of the oxide insulating film 22 by a sputtering method or the like. Finally, a conductive film made of a conductive material such as Al is formed on the oxide semiconductor film 23. Thereafter, the conductive film is etched by photolithography or the like to form the first electrode 24 and the second electrode 25. Through the above process, the semiconductor substrate 21 is obtained. Subsequently, as shown in FIG. 4B, by applying the metal oxide film forming method of this embodiment to a surface to be processed of the semiconductor substrate 21, a gate insulating film 27 formed of a metal oxide film is formed on the semiconductor substrate 21. Subsequently, as shown in FIG. 4C, a third electrode (gate electrode) 28 is formed on the gate insulating film 27 in the trench 26. The third electrode 28 is made of a conductive material such as indium tin oxide. Through the above process, it is possible to achieve a semiconductor device 29 having the conformal gate insulating film 27 with excellent step coverage.

A shape and size (width, depth, etc.) of the trench 26 in the semiconductor substrate 21 are not particularly limited. The depth, width and aspect ratio of the trench 26 may be the same as the depth, width and aspect ratio of the trenches 16 in the above-described semiconductor substrate 11.

A thickness of the gate insulating film 27 may be, for example, 1 Å or more and may be 10,000 Å or less.

While the metal oxide film forming method and the semiconductor device manufacturing method using the metal oxide film forming method according to an embodiment of the present disclosure have been described above, the present disclosure is not limited to the embodiment.

For example, each cycle may not include step S2 and step S4. From the viewpoint of obtaining a more conformal metal oxide film, it is preferable to execute step S2 and step S4 in each cycle.

In some embodiments, in the metal oxide film forming method, after step S2 and step S3 are executed, step S2 and step S3 may be repeated so that the precursor layer is completely oxidized.

In some embodiments, the final cycle of the plurality of cycles may include step S5.

In some embodiments, the metal oxide film forming method may include other steps than the above-described steps as long as they do not hinder the effects of the present disclosure. For example, the metal oxide film forming method may include an additional step of supplying a purge gas into the chamber after step S5 is executed and before step S1 is executed again. Further, each cycle may include another additional step of evacuating the interior of the chamber between step S1 and step S3, in addition to or instead of step S2. By executing the another additional step, it is possible to reliably remove the purge gas from the chamber. Similarly, each cycle may include yet another additional step of evacuating the interior of the chamber between step S3 and step S5, in addition to or instead of step S4, or may include still another additional step of evacuating the interior of the chamber, in addition to or instead of step S6, after step S5 is executed and before step S1 is executed again.

EXAMPLES

Hereinafter, the present disclosure will be described in more detail by way of examples, but the present disclosure is not limited to these examples.

Example 1

The DMol$^3$ module of Software Materials Studio was used to calculate the energy of adsorption of water ($H_2O$) and methyl alcohol ($CH_3OH$) onto a hafnium oxide ($HfO_2$) substrate according to the density functional method (PBE/DN). The hafnium oxide ($HfO_2$) substrate used was a substrate (with unit cell=2×2×1.5) in which monoclinic hafnium oxide ($HfO_2$) crystal is cut out in the (111) plane to form Hf—OH termination. The adsorption energy was calculated for three adsorption modes of Shallow Adsorption, 1H-Bonded Adsorption and 2H-Bonded Adsorption. The results are shown below.

[Adsorption Energy of $H_2O$]

The adsorption energy in Shallow Adsorption was −0.41 eV, the adsorption energy in 1H-Bonded Adsorption was −0.83 eV and the adsorption energy in 2H-Bonded Adsorption was −1.23 eV.

[Adsorption Energy of $CH_3OH$]

The adsorption energy in Shallow Adsorption was −0.61 eV, the adsorption energy in 1H-Bonded Adsorption was −0.97 eV and the adsorption energy in 2H-Bonded Adsorption was −1.34 eV.

As described above, it was confirmed that $CH_3OH$ has higher adsorption energy than $H_2O$ with respect to the hafnium oxide substrate.

According to the present disclosure in some embodiments, it is possible to provide a metal oxide film forming method, which is capable of forming a conformal metal oxide film even under low temperature conditions, and a semiconductor device manufacturing method using the same method. In addition, according to the present disclosure in some embodiments, it is possible to form a conformal capacitor insulating film while reducing a thermal damage to a semiconductor substrate in a process of forming a capacitor insulating film. That is to say, a semiconductor device achieved by the method of the present disclosure includes the conformal capacitor insulating film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device having a metal oxide film in a state in which a workpiece is accommodated in a chamber, the method comprising:

supplying a precursor gas containing a metal complex into the chamber to form a precursor layer on the workpiece from the precursor gas;

supplying an oxidizing gas into the chamber to oxidize the precursor layer so that a metal oxide layer is formed, the oxidizing gas being a gas containing $H_2O$ or a gas having a functional group containing hydrogen atoms in the metal complex and containing an oxidant to generate the $H_2O$ by reaction with the functional group;

supplying an $H_2O$ removal gas containing alcohols or amines into the chamber to remove the $H_2O$ adsorbed onto the metal oxide layer; and executing a plurality of cycles each including the supplying a precursor gas and the supplying an oxidizing gas, wherein at least some of the plurality of cycles includes the supplying an $H_2O$ removal gas.

2. The method of claim 1, wherein the metal oxide film constitutes a capacitor insulating film formed on a semiconductor substrate.

3. The method of claim 1, wherein the metal oxide film constitutes a gate insulating film formed on a semiconductor substrate.

4. A method of forming a metal oxide film on a workpiece by an atomic layer deposition technique in a state in which the workpiece is accommodated in a chamber, the method comprising:

supplying a precursor gas containing a metal complex into the chamber to form a precursor layer on the workpiece from the precursor gas;

supplying an oxidizing gas into the chamber to oxidize the precursor layer so that a metal oxide layer is formed, the oxidizing gas being a gas containing $H_2O$ or a gas having a functional group containing hydrogen atoms in the metal complex and containing an oxidant to generate the $H_2O$ by reaction with the functional group;

supplying an $H_2O$ removal gas containing alcohols or amines into the chamber to remove the $H_2O$ adsorbed onto the metal oxide layer; and executing a plurality of cycles each including the supplying a precursor gas and the supplying an oxidizing gas, wherein at least some of the plurality of cycles includes the supplying an $H_2O$ removal gas.

5. The method of claim 1, further comprising: supplying a purge gas into the chamber between the supplying a precursor gas and the supplying an oxidizing gas.

6. The method of claim 1, further comprising: supplying a purge gas into the chamber between the supplying an oxidizing gas and the supplying an $H_2O$ removal gas.

7. The method of claim 1, wherein no purge gas is supplied into the chamber before the supplying a precursor gas is again executed after the supplying an $H_2O$ removal gas.

8. The method of claim 1, wherein a final cycle of the plurality of cycles does not include the supplying an $H_2O$ removal gas.

9. The method of claim 1, wherein the $H_2O$ removal gas contains at least one selected from a group consisting of alcohols including methyl alcohol, ethyl alcohol, n-propyl alcohol, isopropyl alcohol and t-butyl alcohol.

10. The method of claim 1, wherein the metal complex is a hafnium complex, a zirconium complex, an aluminum complex, a tantalum complex, a tungsten complex, a titanium complex, a niobium complex, a molybdenum complex, a cobalt complex or a nickel complex.

11. The method of claim 10, wherein the metal complex contains at least one selected from a group consisting of $Hf[N(CH_3)_2]_4$, $Hf[N(CH_2CH_3)(CH_3)]_4$, $Hf[N(CH_3)_2]_3[C_5H_5]$, $Hf[N(CH_2CH_3)_3]_4$ and $Hf[OC(CH_3)_3]_4$ as the hafnium complex.

12. The method of claim 1, wherein the oxidizing gas is a gas containing at least one selected from a group consisting of $O_3$, $H_2/O_2$ mixture, $O_2$ plasma, $O_2$ and $H_2O_2$.

13. The method of claim 1, wherein the supplying a precursor gas includes supplying a first dilution gas into the chamber, together with the precursor gas, the first dilution gas containing at least one selected from a group consisting of an He gas, an Ne gas, an Ar gas, a Kr gas, a Xe gas, an $N_2$ gas, a $CO_2$ gas and a CO gas.

14. The method of claim 1, wherein the supplying an oxidizing gas includes supplying a second dilution gas into the chamber, together with the oxidizing gas, the second dilution gas containing at least one selected from a group consisting of an He gas, an Ne gas, an Ar gas, a Kr gas, a Xe gas, an $N_2$ gas, a $CO_2$ gas and a CO gas.

15. The method of claim 1, wherein the supplying an $H_2O$ removal gas includes supplying a third dilution gas into the chamber, together with the $H_2O$ removal gas, the third dilution gas containing at least one selected from a group consisting of an He gas, an Ne gas, an Ar gas, a Kr gas, a Xe gas, an $N_2$ gas, a $CO_2$ gas and a CO gas.

* * * * *